(12) United States Patent
Schoonejongen et al.

(10) Patent No.: US 6,534,338 B1
(45) Date of Patent: Mar. 18, 2003

(54) METHOD FOR MOLDING SEMICONDUCTOR PACKAGE HAVING A CERAMIC SUBSTRATE

(75) Inventors: Ronald J. Schoonejongen, Chandler, AZ (US); Frank Juskey, Phoenix, AZ (US); Anthony J. LoBianco, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/895,767

(22) Filed: Jun. 29, 2001

(51) Int. Cl.[7] .................. H01L 21/44; H01L 21/48; H01L 21/50
(52) U.S. Cl. ............... 438/107; 438/112; 438/127; 257/787
(58) Field of Search ................ 257/787; 438/107, 438/112, 127

(56) References Cited

U.S. PATENT DOCUMENTS

| | | | |
|---|---|---|---|
| 3,982,979 A | 9/1976 | Hentz et al. ............... 156/73.6 |
| 4,525,597 A | * 6/1985 | Abe ........................ 174/52 |
| 4,530,152 A | 7/1985 | Roche et al. ............... 29/588 |
| 5,200,362 A | 4/1993 | Lin et al. ................ 437/207 |
| 5,273,938 A | 12/1993 | Lin et al. ................ 437/207 |
| 5,474,958 A | 12/1995 | Djennas et al. ............ 437/211 |
| 5,620,928 A | 4/1997 | Lee et al. ................ 438/118 |
| 5,729,437 A | 3/1998 | Hashimoto ................. 257/787 |
| 5,766,535 A | 6/1998 | Ong ..................... 264/272.15 |
| 5,776,798 A | 7/1998 | Quan et al. ............... 438/112 |
| 5,894,108 A | 4/1999 | Mosatafazadeh et al. ... 174/52.4 |
| 5,929,522 A | 7/1999 | Weber ..................... 257/738 |
| 5,937,512 A | 8/1999 | Lake et al. ................ 29/832 |
| 6,001,671 A | 12/1999 | Fjelstad ................... 438/112 |
| 6,350,668 B1 | * 10/2000 | Chakravorty ............... 438/612 |
| 6,350,631 B1 | * 2/2002 | Kobayashi et al. ......... 438/107 |

* cited by examiner

Primary Examiner—David Nelms
Assistant Examiner—Tu-Tu Ho
(74) Attorney, Agent, or Firm—Skjerven Morrill LLP; James E. Parsons (57) ABSTRACT

A method for overmolding a ceramic substrate for a semiconductor chip or other electrical device, and a resulting package, are disclosed. In one embodiment, plural ceramic substrate panels having a matrix of semiconductor chips thereon are precisely located on and attached to a temporary support member using an alignment tool. The member and the attached ceramic substrate panels are then placed in a mold tool. When the mold tool is closed, it clamps down on the member around the ceramic substrate panel, and not on the ceramic substrate panel itself. A mold compound injected into the mold tool encapsulates the chips and ceramic substrate panels. Subsequently, packages each containing a chip are singulated from the encapsulated ceramic substrate panels.

32 Claims, 12 Drawing Sheets

METHOD FOR MOLDING SEMICONDUCTOR PACKAGE HAVING A CERAMIC SUBSTRATE

BACKGROUND OF THE INVENTION

1. Field of the Invention

The present invention relates to the field of semiconductor packaging.

2. Related Art

During a typical transfer molding process for making plastic semiconductor packages, multiple substrate panels are placed in a mold tool. The mold tool includes opposing platens and open cavities. Each substrate panel includes multiple substrates having electrically conductive paths, such as metal traces and vias, formed thereon. A semiconductor chip, and possibly other electrical components, is disposed on each of the substrates of the substrate panel. When the mold tool is closed, the opposing platens clamp down onto the substrate panels. A plastic mold compound, such as epoxy, is then injected into the open cavities, so as to encapsulate the semiconductor chip and the surrounding substrate surface. After the mold compound has cured, the substrate panels are removed from the mold tool, whereupon the mold compound may be further cured. Finally, the encapsulated substrate panels are cut, such as by sawing or punching, so as to singulate individual packages each including an encapsulated substrate with a semiconductor chip thereon.

Such conventional molding techniques are used to make packages having a metal leadframe substrate or a printed circuit board substrate. However, such molding techniques are not used to make packages having ceramic substrates. This is because conventional molding techniques damage the ceramic substrate panels that include the ceramic substrates. Ceramic substrate panels are brittle and are slightly warped due to the firing process used to make them. If ceramic substrate panels were placed in a mold tool and the opposing platens of the mold tool were to clamp down on the ceramic substrate panels, the clamping pressures would cause the brittle and slightly warped ceramic substrate panels to fracture or crack. On the other hand, laminate or leadframe substrate panels are flexible, and therefore are capable of withstanding the clamping pressures of the mold tool.

Since ceramic substrate panels cannot be molded, other techniques have been used to encapsulate semiconductor devices mounted on ceramic substrates. For example, metal or ceramic covers can be mounted on the ceramic substrate over the semiconductor device, or liquid encapsulation techniques may be used. These techniques are slower and more costly than molding techniques.

Accordingly, what is needed is a method for molding semiconductor packages that include a ceramic substrate.

SUMMARY

Embodiments of the present invention include methods for making a package for a semiconductor chip or other electronic device, where the package includes a body of a molded encapsulant formed over the chip and a ceramic substrate. Accordingly, it is now possible to achieve the economic advantages of using a molding step to encapsulate the semiconductor chip, while at the same time using a ceramic substrate in the package.

In one embodiment, plural ceramic substrate panels each having a matrix of semiconductor chips thereon are precisely located on and attached to a temporary support member using an alignment tool. The member and the attached ceramic substrate panels are then placed in a mold tool. When the mold tool is closed, it clamps down on the member around the ceramic substrate panel, and not on the ceramic substrate panel itself. A mold compound is then injected into the mold tool to encapsulate the chips and ceramic substrate panels. Subsequently, packages each containing a chip are singulated from the encapsulated ceramic substrate panels.

Other aspects of the present invention will become apparent from the following description of the exemplary embodiments and from the accompanying drawings thereof.

BRIEF DESCRIPTION OF THE DRAWINGS

In the drawings, like numerals are used for like parts of the various drawings.

DETAILED DESCRIPTION

Figure 1A:
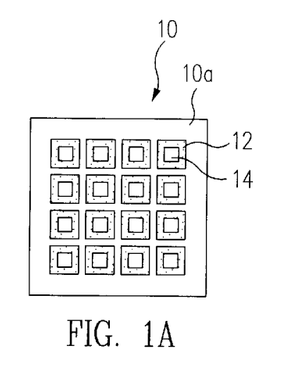
FIG. 1A is a top plan view of a ceramic substrate panel having multiple ceramic substrate upon which a semiconductor chip is mounted.
Figure 1B:
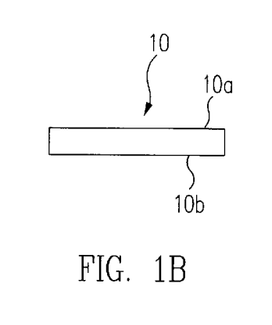
FIG. 1B is side view of the ceramic substrate panel of FIG. 1A.

FIGS. 1A and 1B are a top plan view and a side view, respectively, of a rectangular substrate panel 10, according to one embodiment of the present invention. In this embodiment, substrate panel 10 is formed of any fired ceramic material, such as 96–99% alumina or boro-silicate glass compositions of varying ratios. Ceramic substrate panel 10 has a first face 10a and an opposing second face 10b. Ceramic substrate panel 10 includes a four by four matrix of sixteen integral ceramic substrates 12. A semiconductor chip 14 is mounted on each ceramic substrate 12.

Figure 1C:
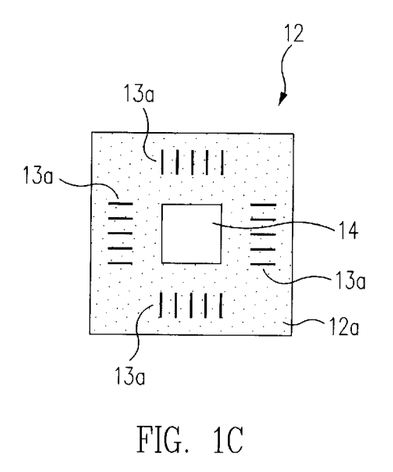
FIG. 1C is a top plan view of one of the ceramic substrates of FIG. 1A.
Figure 1D:
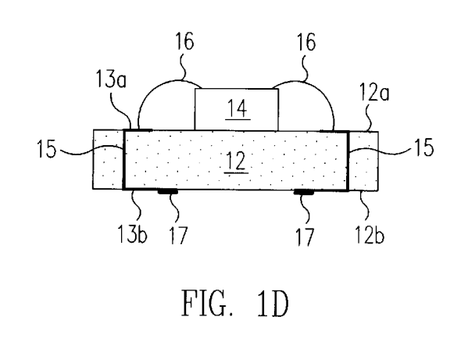
FIG. 1D is a side view of the ceramic substrate of FIG. 1C.

FIGS. 1C and 1D are a top plan view and a side view, respectively, of one ceramic substrate 12 of ceramic substrate panel 10. Ceramic substrate 12 has a first face 12a and a second face 12b. As shown, first face 12a and second face 12b are entirely flat. In some embodiments, the thickness of ceramic substrate 12 (i.e., the distance from first face 12a to second face 12b) is approximately 30 to 60 mils, although the dimensions can vary. An electronic device, such as a semiconductor chip 14, is attached to first face 12a of ceramic substrate 12 with an adhesive material. Other electronic devices, such as resistors, capacitors, or inductors, also can be mounted on first face 12a of ceramic substrate. Semiconductor chip 14 is electrically connected to a plurality of electrically conductive traces 13a on first face 12a by wire bonds 16 or equivalent electrical conductors (e.g., a flip chip connection).

Figure 2A:
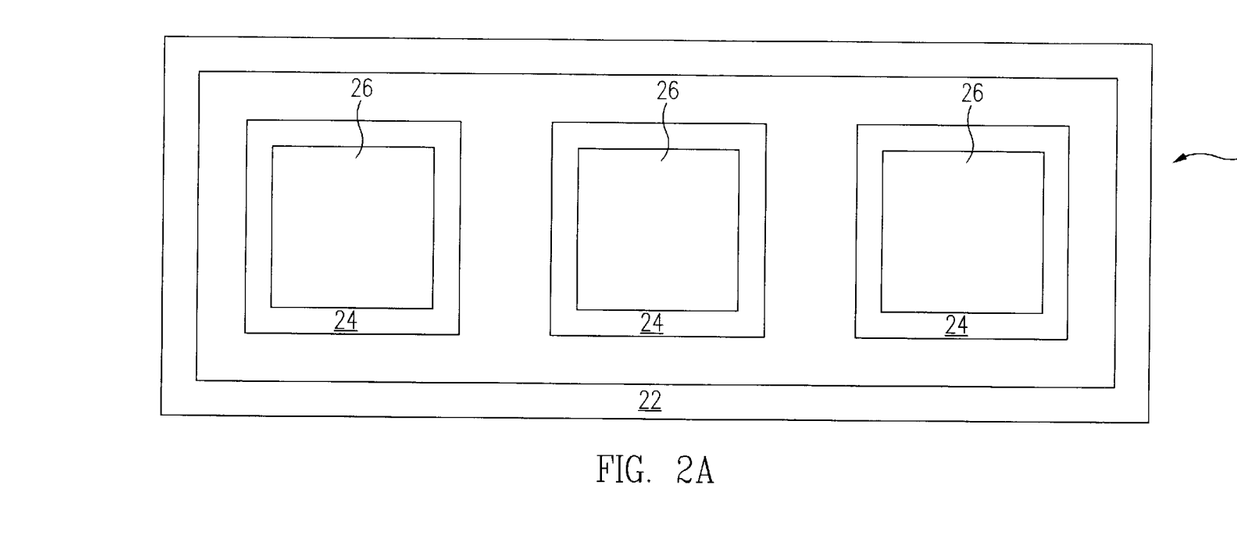
FIG. 2A is a top plan view of a bottom alignment tool for aligning ceramic substrate panels on a temporary support member.
Figure 2B:
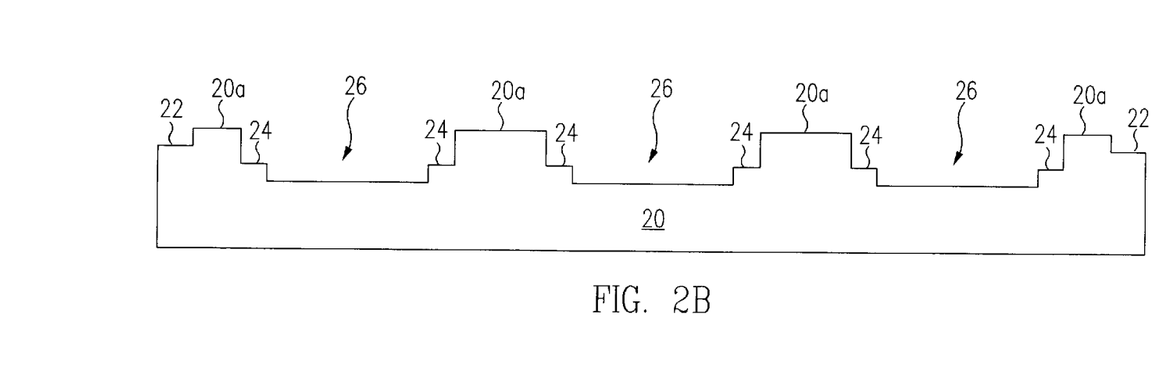
FIG. 2B is a cross-sectional side view of the bottom alignment tool of FIG. 2A.

FIGS. 2A and 2B are a top plan view and a cross-sectional side view, respectively, of a bottom alignment tool 20, according to one embodiment of the present invention. Bottom alignment tool 20 includes a first face 20a, a peripheral shoulder 22, cavities 26, and cavity shoulders 24 around each cavity 26. Three cavities 26 are shown, but the number may vary according to the number of ceramic substrate panels 10 to be overmolded in parallel.

Figure 3A:
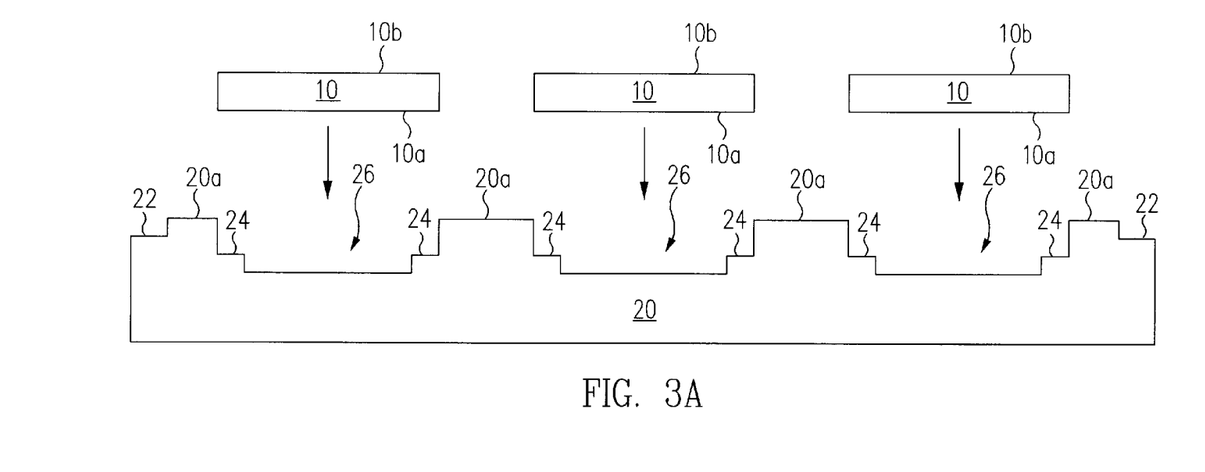
FIG. 3A is a cross-sectional side view of the bottom alignment tool of FIG. 2B and three ceramic substrate panels before the ceramic substrate panels are inserted into the bottom alignment tool.
Figure 3B:
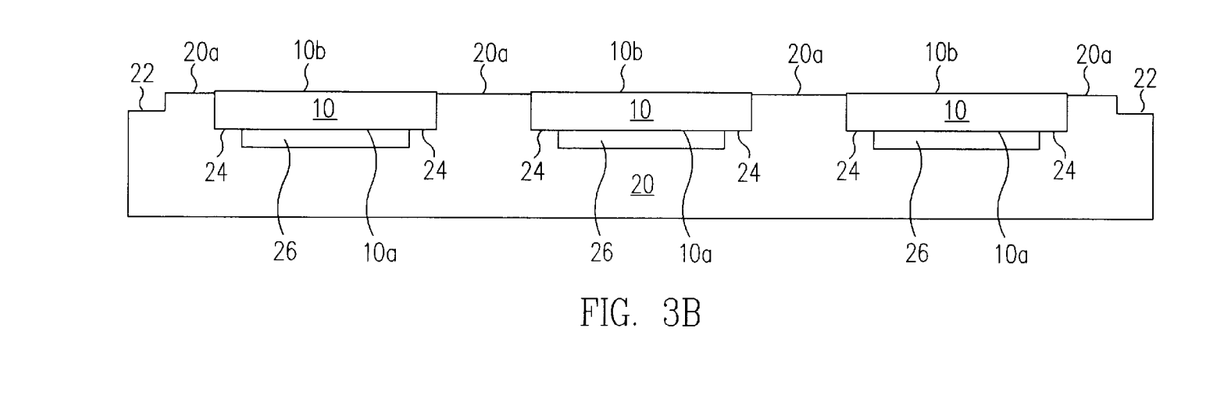
FIG. 3B is a cross-sectional side view of the bottom alignment tool of FIG. 3A after the ceramic substrate panels are inserted into the bottom alignment tool.

FIG. 3A is a cross-sectional side view of bottom alignment tool 20 and three ceramic substrate panels 10 positioned for insertion into bottom alignment tool 20. The ceramic substrate panels 10 each superimpose the cavity shoulder 24 of a cavity 26. The ceramic substrate panels 10 are then lowered onto bottom alignment tool 20 and each ceramic substrate panel 10 comes to rest when the first face 10a of the ceramic substrate panel 10 contacts the underlying cavity shoulder 24. The arrayed semiconductor chips 14 (not shown, but see FIGS. 1A–1D) on first face 10a of ceramic substrate panels 10 are inserted into the cavities 26 of bottom alignment tool 20. Cavities 26 are deep enough so that the arrayed semiconductor chips 14 do not contact bottom alignment tool 20. FIG. 3B is a cross-sectional side view of bottom alignment tool 20 and the three ceramic substrate panels 10 after the ceramic substrate panels 10 are at rest on cavity shoulder 24 over respective cavities 26 of bottom alignment tool 20. As shown in FIG. 3B, second face 10b of the ceramic substrate panels 10 extend slightly above first face 20a of bottom alignment tool 20 when inserted into bottom alignment tool. In other embodiments (not shown), second face 10b of the ceramic substrate panels 10 are flush with first face 20a of bottom alignment tool 20 when inserted into bottom alignment tool.

Figure 4A:
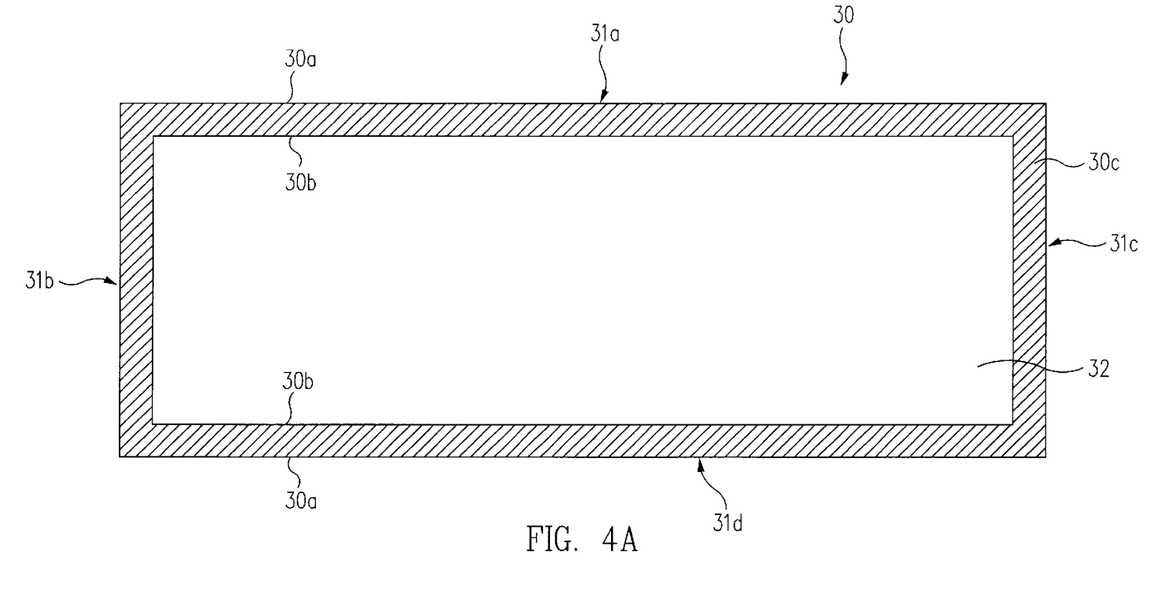
FIG. 4A is a top plan view of a top alignment tool.
Figure 4B:
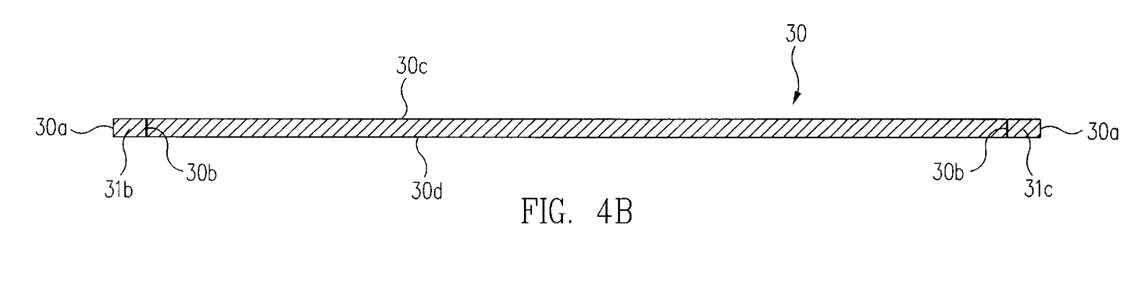
FIG. 4B is a cross-sectional side view of top alignment tool of FIG. 4A.

FIGS. 4A and 4B are a top plan view and a cross-sectional side view, respectively, of a top alignment tool 30. Top alignment tool 30 is a rectangular frame that includes four unitary rectilinear members 31a, 31b, 31c, and 31d. Top alignment tool 30 has an outer peripheral wall 30a, an inner peripheral wall 30b, a first face 30c, and a second face 30d. Members 31a, 31b, 31c, and 31d surround a rectangular vacant area 32. In some embodiments, members 31b and 31c are approximately 62 millimeters long, members 31a and 31d are approximately 230 millimeters long, the distance from outer peripheral wall 30a to inner peripheral wall 30b is approximately 3–5 millimeters, and the distance from first face 30c to second face 30d is approximately 0.2 to 0.4 millimeters and is typically 0.25 millimeters.

Figure 5A:
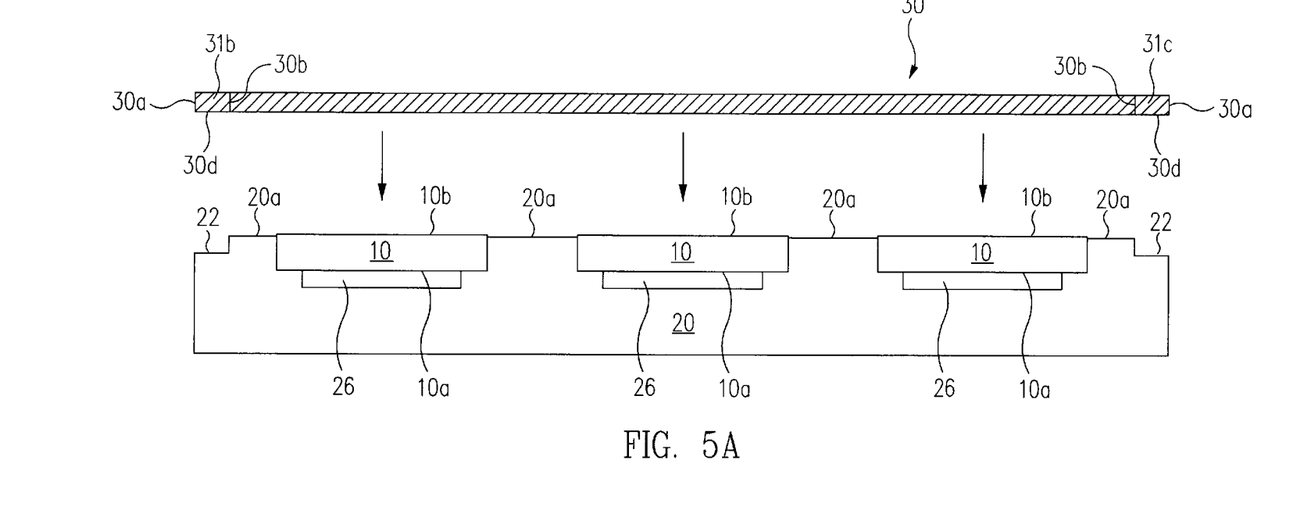
FIG. 5A is a cross-sectional side view of the bottom alignment tool and the top alignment tool of FIGS. 3A and 4A, respectively, before the top alignment tool is placed on the bottom alignment tool.
Figure 5B:
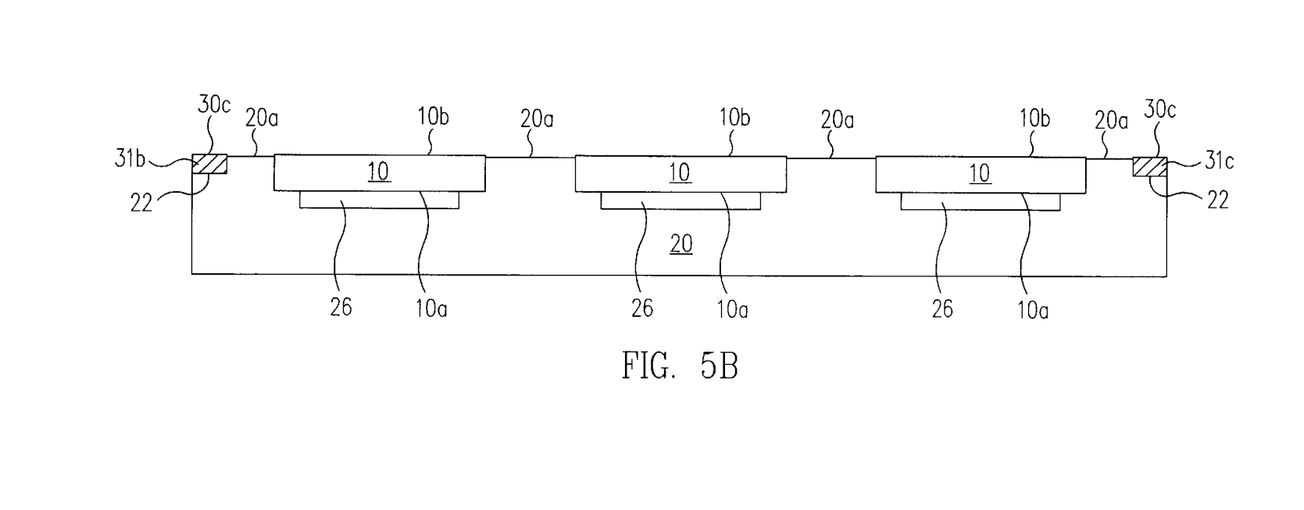
FIG. 5B is a cross-sectional side view of the top alignment tool and the bottom alignment tool of FIG. 5A after the top alignment tool has been placed on the bottom alignment tool.
Figure 5C:
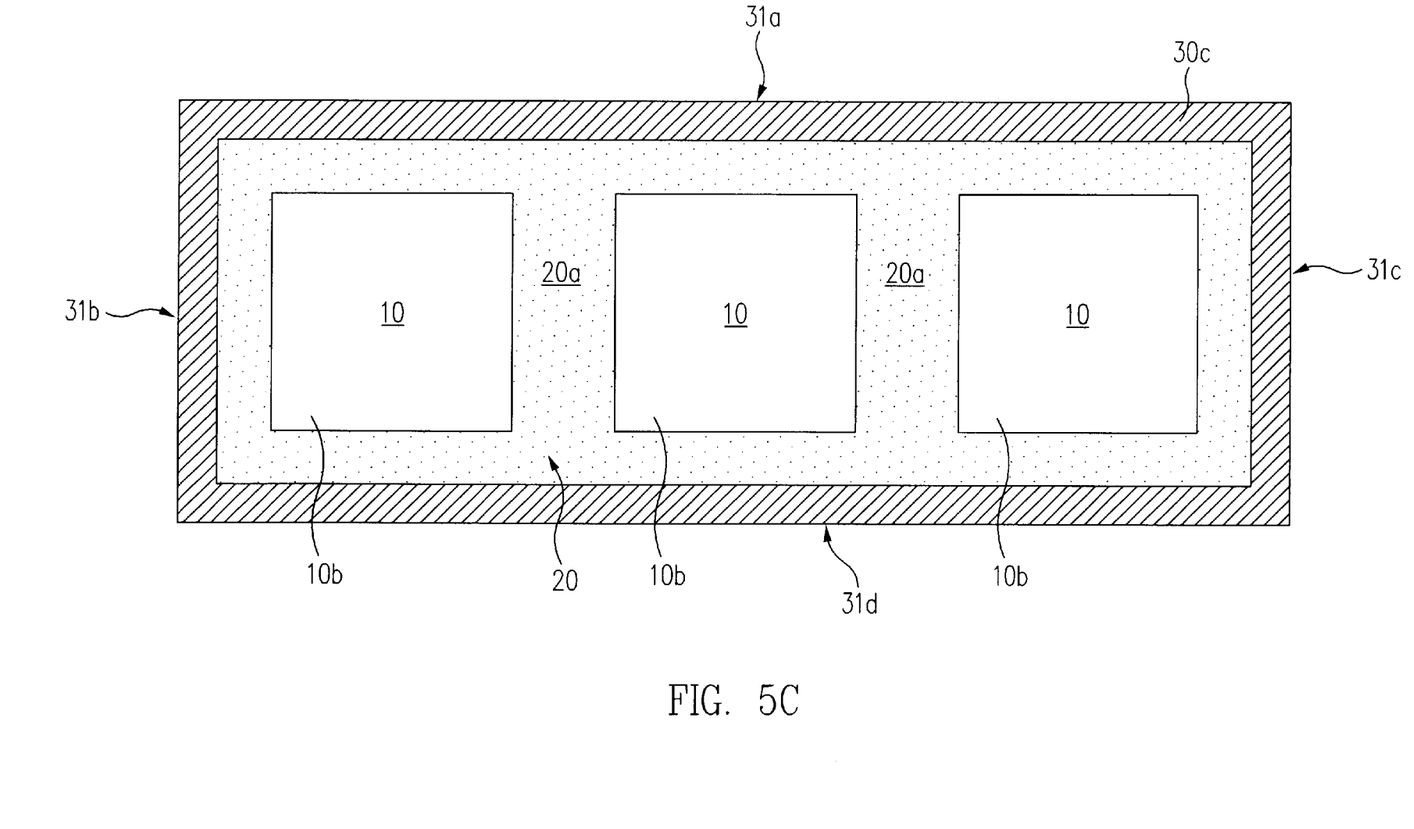
FIG. 5C is a top plan view of FIG. 5B.

FIG. 5A is a cross-sectional side view of top alignment tool 30 before top alignment tool 30 is placed on bottom alignment tool 20, which has three ceramic substrate panels 10 placed thereon. Unitary members 31a–31d of top alignment tool 30 are aligned with peripheral shoulder 22. Top alignment tool 30 is then lowered onto bottom alignment tool 20 and comes to rest when second face 30d of members 31a–31d of top alignment tool 30 contacts peripheral shoulder 22. FIG. 5B is a cross-sectional side view of top alignment tool 30 and bottom alignment tool 20, which has three ceramic substrate panels 10 inserted therein, after top alignment tool 30 has been placed on bottom alignment tool 30. As shown in FIG. 5B, first face 30c of top alignment tool 20 and second face 10b of ceramic substrate panels 10 are approximately level with one another (i.e., horizontally) and both are slightly higher (i.e., vertically) than first face 20a of bottom alignment tool 20 after ceramic substrate panels 10 and top alignment tool 30 have been inserted in their respective positions on bottom alignment tool 20. FIG. 5C is a top plan view of FIG. 5B, wherein three ceramic substrate panels 10 are visible through vacant area 32 of top alignment tool 30.

Figure 6A:
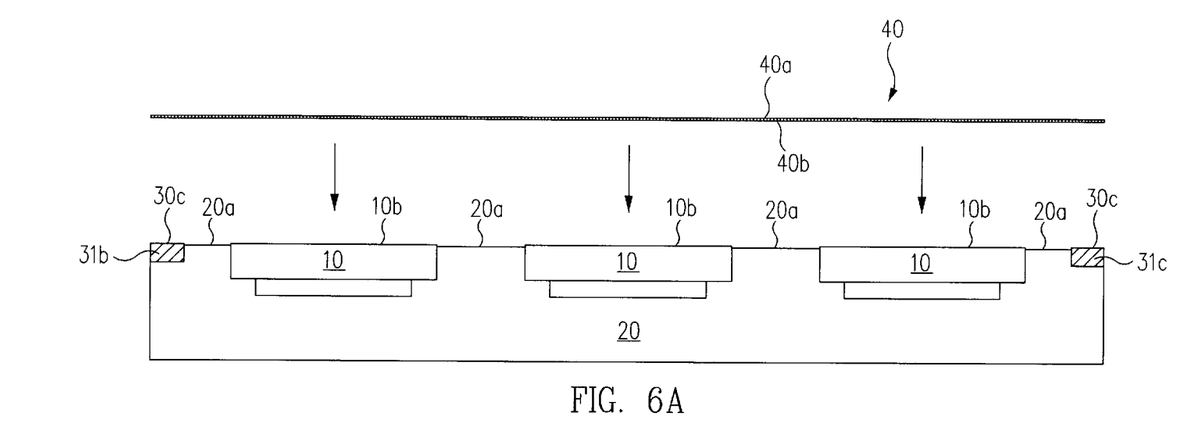
FIG. 6A is a cross-sectional side view of a temporary support member superimposed over the alignment tool of FIG. 5B.

FIG. 6A is a cross-sectional side view of a temporary supporting member 40 that is to be placed over the structure shown in FIG. 5B so as to cover the upper surface 30c of the four rectilinear members 31a–31d positioned on top alignment tool 30 and the second face 10b of the three ceramic substrate panels 10 positioned on bottom alignment tool 20. Member 40 includes a first face 40a, and a second face 40b having an adhesive layer either entirely over its area or on the areas facing the four rectilinear members 31a–31d and the three ceramic substrate panels 10. The area of member 40 is equal to or approximately equal to the area defined by the outer peripheral wall 30a of top alignment tool 30 (see FIG. 4A). In some embodiments, the area of member 40 is approximately 62 millimeters by 230 millimeters.

Figure 6B:
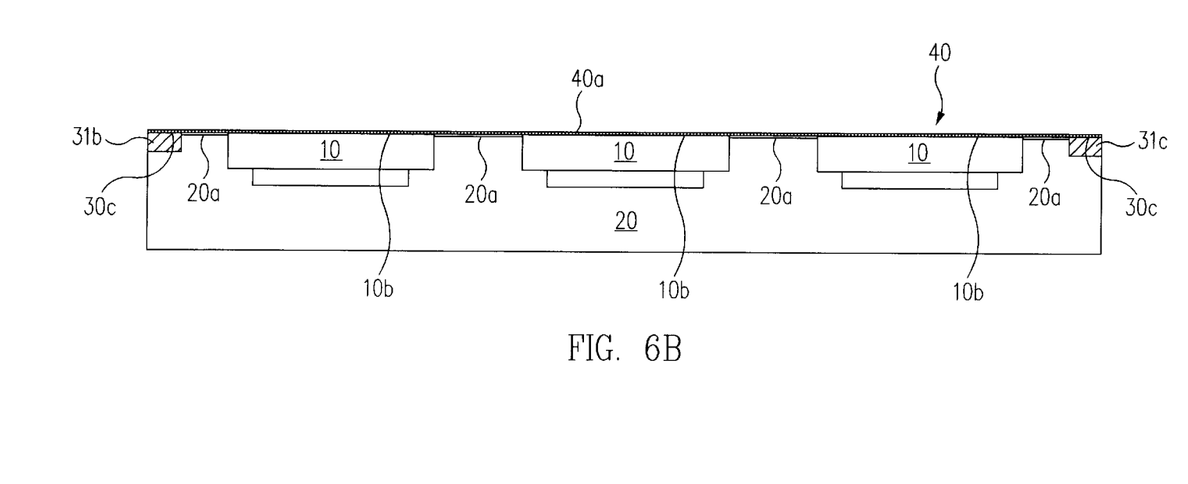
FIG. 6B is a cross-sectional side view of the member and the alignment tool of FIG. 6A after the member has been attached to the top alignment tool and to the ceramic substrate panels.

Member 40 is aligned with outer peripheral wall 30a of the members 31a–31d of top alignment tool 30. Member 40 is then lowered and comes to rest when second face 40b of member 40 contacts and attaches to first face 30c of members 31a–31d and second face 10b of the ceramic substrate panels 10. Pressure and/or heat may be applied to first face 40a of member 40 to improve adhesion between second face 40b of member 40 and ceramic substrate panels 10. In some embodiments, member 40 is roll laminated onto first face 30c of members 31a–31d and the three substrates 10. FIG. 6B is a cross-sectional side view of member 40, bottom alignment tool 20 (with three ceramic substrate panels 10 inserted therein) and top alignment tool 30 after member 40 has been attached to first face 30c of members 31a–31d and the three ceramic substrate panels 10. Attachment member 40 completely covers members 31a, 31b, 31c, 31d and the three ceramic substrate panels 10.

Member 40 can be any type of material or combination of materials that are capable of adhering to and supporting ceramic substrate panels 10 within and between subsequent processes (e.g., molding). Member 40 can be a polyimide adhesive tape such as Kapton®, APICAL®, or Upilex®. Tooling holes may be provided through member 40 to facilitate processing using automated processing equipment.

Figure 7A:
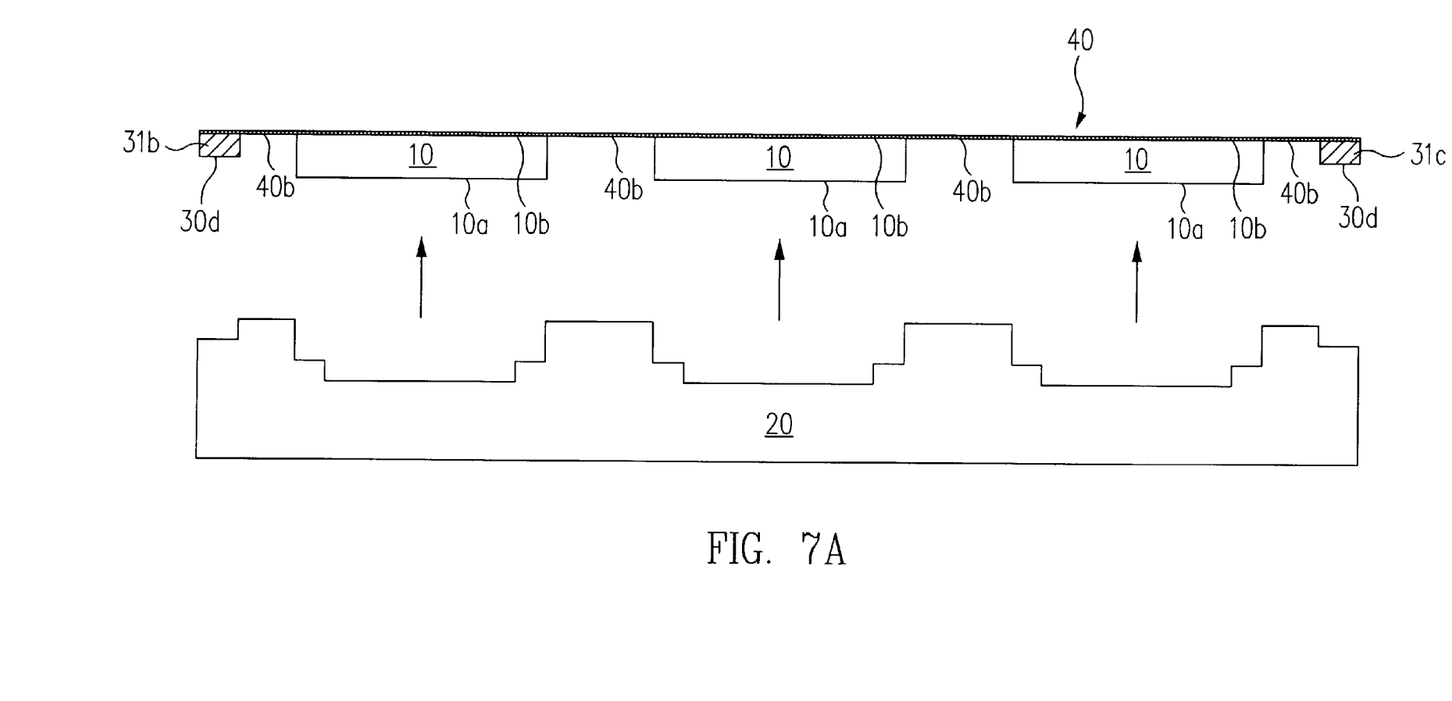
FIG. 7A is a cross-sectional side view of the member of FIG. 6B after the member has been removed from the bottom alignment tool, wherein the top alignment tool and the ceramic substrate panels are fixed to the member.
Figure 7B:
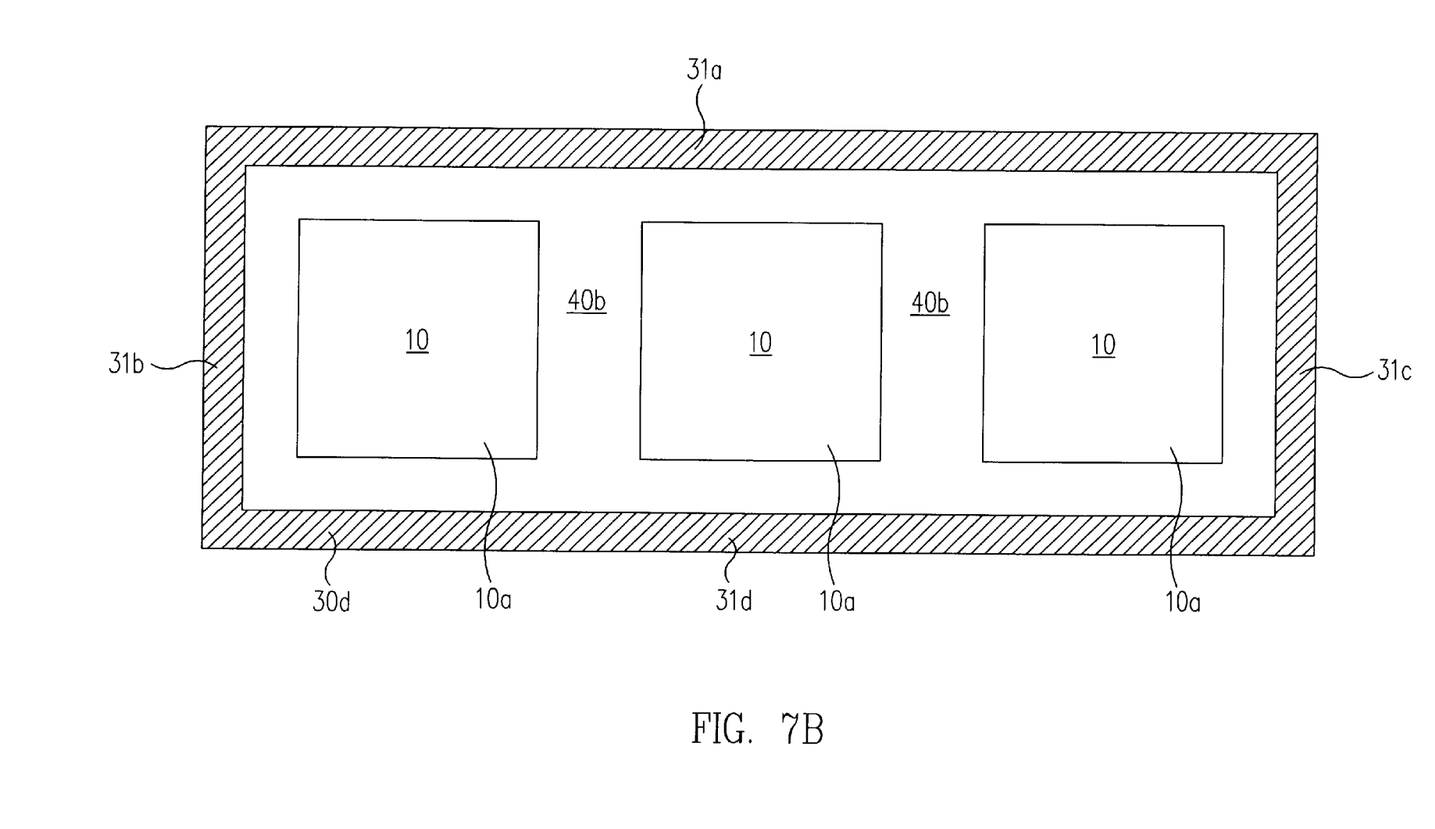
FIG. 7B is a bottom plan view of the member of FIG. 7A.

FIGS. 7A and 7B are a cross-sectional side view and a bottom plan view, respectively, of member 40 of FIG. 6B after the member 40 has been removed from the bottom alignment tool 20. The adhesive bond between second face 40b of member 40, first face 30c of members 31a–31d of top alignment tool 30, and second face 10b of the three ceramic substrate panels 10 is strong enough that the ceramic substrate panels 10 remain attached to member 40. Further, each ceramic substrate panel 10 is precisely fixed to member 40 at a specific location through the use of alignment tools 20 and 30. Precisely fixing each ceramic substrate panel 10 to a specific location of member 40 allows ceramic substrate panels 10 and member 40 to be processed using automated processing equipment. Ceramic substrate panels 10 need to be precisely located for steps such as molding or cutting the ceramic substrate panels. Furthermore, top alignment tool 30 provides a relatively rigid structure for moving the ceramic substrate panels 10 using automated processing equipment.

As mentioned above, ceramic substrate panels 10 include a matrix of interconnected ceramic substrates 12, as shown in FIGS. 1A–1D. Before the alignment and affixing of the three ceramic substrate panels 10 to member 40 within top alignment tool 20, a semiconductor chip 14 is mounted on and electrically connected to each ceramic substrate 12 of the ceramic substrate panel 10. Accordingly, the populated assembly is ready for an encapsulation step, as exemplified by the overmolding process depicted in FIGS. 8A–8D.

Alternatively, the mounting and electrical connection of the respective semiconductor chips 14 to the respective substrates 12 of the ceramic substrate panels 10 may be performed after the attachment of ceramic substrate panels 10 within top alignment tool 20. The chip attach and electrical connection steps may be accurately performed because of the precise alignment of the ceramic substrate panels 10 on attachment member 40.

Figure 8A:
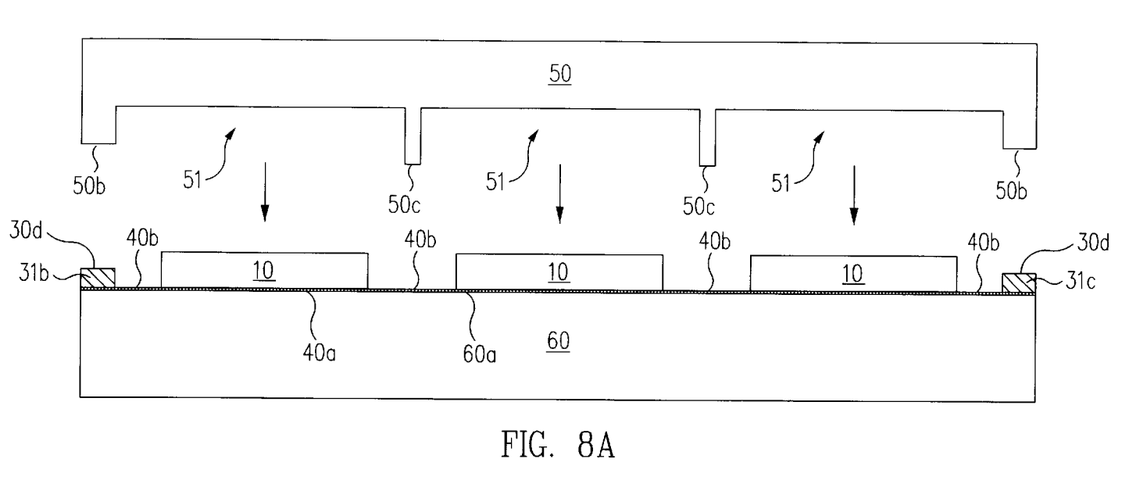
FIG. 8A is a cross-sectional side view of a top mold tool platen and a bottom mold tool platen with the member of FIG. 7A therein.

FIG. 8A is a cross-sectional side view of an open, two-piece mold tool having a top mold tool platen 50 and a bottom mold tool platen 60. The mold tool typically is a transfer molding tool, but also may be an injection molding tool. Member 40 having the top alignment tool 30 and the three ceramic substrate panels 10 attached thereto are placed on bottom mold tool platen 60. Top mold tool platen 50 includes separation members 50b, separation members 50c, and mold cavities 51. Bottom mold tool platen 60 includes a first face 60a. First face 40a of member 40 is placed on first face 60a of bottom mold tool platen 60. Top mold tool platen 50 is aligned such that separation members 50b superimpose members 31b and 31c of top alignment tool 30 and such that separation members 50c superimpose portions of member 40 between the ceramic substrate panels 10. The mold tool is then closed. Top mold tool platen 50 is then lowered and separation members 50b contact of members 31b and 31c while separation members 50c contact the exposed portions of second face 40b of member 40 between the ceramic substrate panels 10. Members 50b are shorter than members 50c so that when the mold tool is closed, the mold cavities 51 surrounding each ceramic substrate panel 10 are isolated from one another. Since top mold tool platen 50 and bottom mold tool platen 60 clamp onto members 31b and 31c of top alignment tool 30 and member 40 (and not onto any portion of ceramic substrate panels 10), ceramic substrate panels 10 are not damaged by the mold tool clamping process.

Figure 8B:
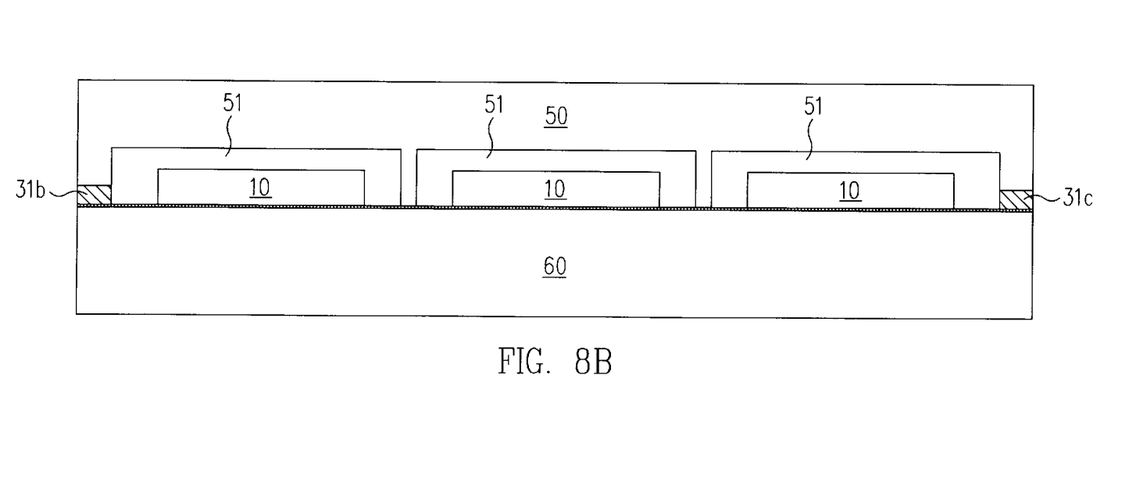
FIG. 8B is a cross-sectional side view of the mold tool of FIG. 8A clamped on the member.

It should be recognized that other mold tools can be used in accordance with the present invention. For example, FIG. 8D is a cross-sectional side view of an open, two-piece mold tool having a top mold tool platen 50 and a bottom mold tool platen 60. The mold tool of FIG. 8D is similar to the mold tool of FIG. 8A except that it does not include separation members 50c. Alternatively, a mold tool (not shown) that does not clamp down on top alignment tool 30 can also be used.

After the mold tool is closed, a plastic mold compound compatible with ceramic materials, such as an epoxy, is injected into each of mold cavities 51. Suitable mold compounds include SMTB-RC and NX-G available from Plaskon Electronic Materials Inc. and 100-XJAA available from Nitto Denko America, Inc. The mold compound fully covers the peripheral sides and first face 10a of each ceramic substrate panel 10 and the semiconductor chips 14 arrayed on first face 10a. The mold compound may be opaque (e.g., black) or optically clear, where semiconductor chip 14 is an optical device.

Figure 8C:
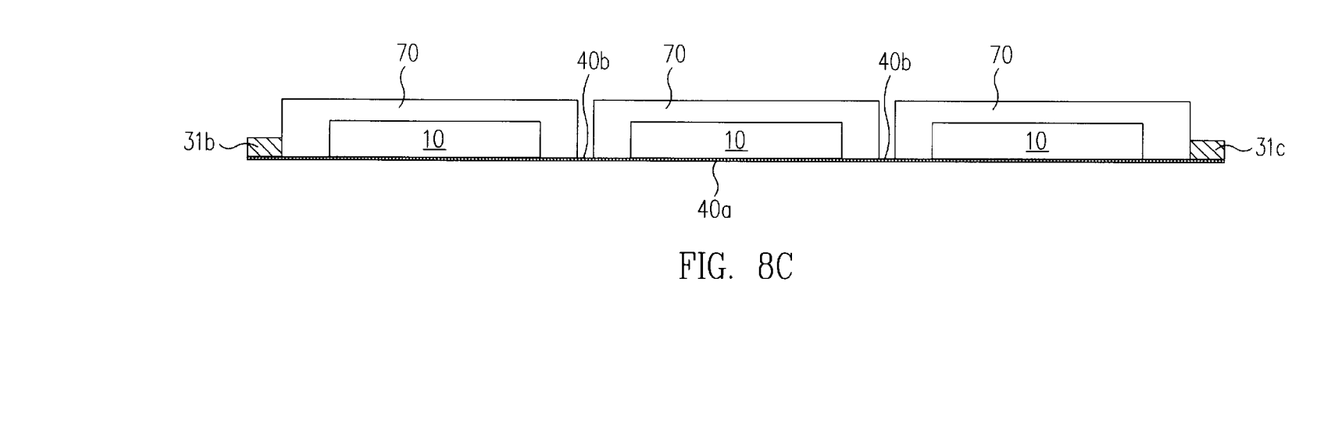
FIG. 8C is a cross-sectional side view of the member of FIG. 7A after the ceramic substrate panels have been encapsulated within the mold tool of FIG. 8B.
Figure 8D:
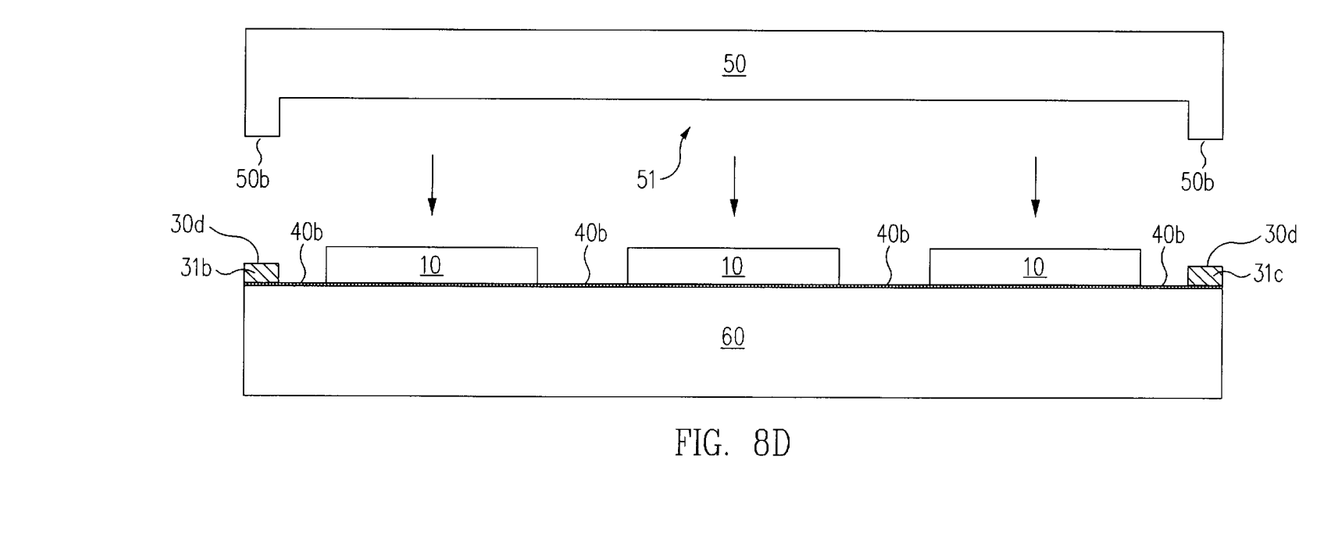
FIG. 8D is a cross-sectional side view of an alternative top mold tool platen and a bottom mold tool platen with the member of FIG. 7A therein.
Figure 9:
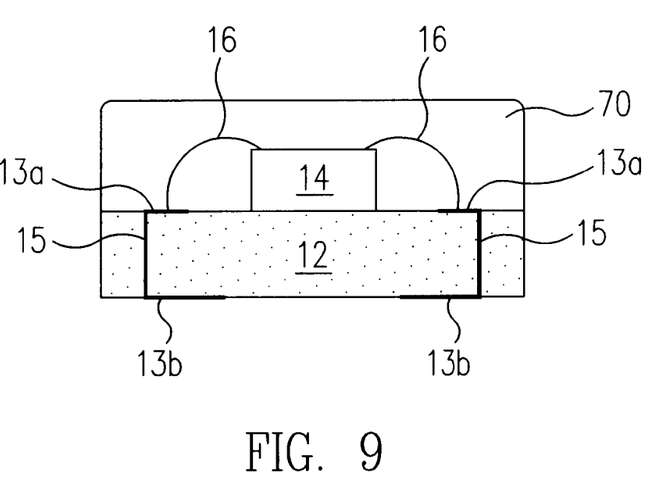
FIG. 9 is a cross-sectional side view of a molded semiconductor package having a ceramic substrate.

After the mold compound material is cured, the ceramic substrate panels 10 are removed from the mold tool, as shown in FIG. 8C. The mold compound 70 may be further cured outside of the mold tool if desired. The ceramic substrate panels 10 can then be singulated and laser marked. The ceramic substrate panels 10 can be singulated into individual packages (as shown in FIG. 9) using a singulation tool, such as a saw that cuts through the mold compound 70 and the ceramic substrate panel 10 between the package sites without cutting fully through attachment member 40.

Next, member 40 can be separated from the top alignment tool 30 and the ceramic substrate panels 10. For example, member 40 can be peeled from the respective ceramic substrate panels 10, and may be exposed to solvents or U.V. light to facilitate the peeling. As member 40 is removed, the individual ceramic substrates 12 separate from member 40, yielding individual molded ceramic substrate packages (see FIG. 9). Top alignment tool 30 can then be reused.

Alternatively, member 40 can be separated from top alignment tool 30 and ceramic substrate panels 10 and then ceramic substrate panels can be singulated and laser marked.

In the embodiment of FIGS. 8A–8C, each ceramic substrate panel 10 is over-molded within an individual block of the mold compound. Accordingly, the singulation process must cut through both the molded encapsulant 70 and the underlying ceramic substrate panel 10 around each ceramic substrate 12. A resulting semiconductor package (See FIG. 9) has orthogonal peripheral sidewalls formed of coincident portions of encapsulant 70 and ceramic substrate 12. Hardened, molded encapsulant material 70 provides an insulative, protective covering for semiconductor chip 14 (and/or other electronic components) disposed on substrate 12. As shown in FIG. 9, the upper surface of ceramic substrate 12, on which encapsulant material 70 is disposed, and the opposing lower surface of ceramic substrate 12 are entirely flat.

The molding method described above allows ceramic substrate panels to be molded (e.g., transfer molded) without damaging the ceramic substrate panels or their constituent ceramic substrates. This will reduce the cost of ceramic substrate packages, because inexpensive plastic molding compounds and molding techniques can now be applied to ceramic substrates. Furthermore, conventional mold tooling can be utilized for the molding step.

The molding method described above can be used with any type of ceramic substrate, such as post fired ceramic substrates, low-temperature cofired ceramic (LTCC) substrates, high-temperature cofired ceramic (HTCC) substrates, or other ceramic substrates. The methods described above can also be used with other substrate mediums that are fragile and/or are not perfectly planar such as barium titinate, sapphire, synthetic diamond, silicon nitride, or aluminum nitride.

Further, while the above-exemplary process operated on ceramic substrate panels comprised of a matrix of 16 joined ceramic substrates, the number of ceramic substrates of a panel may vary. Further, the method may be performed on single ceramic substrates rather than a panel of arrayed ceramic substrates.

While particular exemplary embodiments of the present invention have been shown and described, it should be understood that various changes, substitutions, and alterations can be made therein without departing from the scope of the invention as defined by the appended claims.

What is claimed is:

1. A method for fabricating a plurality of packages, the method comprising:

providing a ceramic substrate panel having a first side and a perimeter, wherein a matrix of electronic devices are coupled to the ceramic substrate panel and a member is attached to the first side, said member extending beyond said perimeter;

placing the ceramic substrate panel and attached member in a mold tool;

closing the mold tool, wherein the mold tool clamps over the member entirely outward of the perimeter of the ceramic substrate panel;

providing a mold compound into the mold tool so as to encapsulate the electronic devices and a portion of the ceramic substrate panel, and hardening the mold compound; and singulating a plurality of packages from the ceramic substrate panel, wherein each package contains at least one of the electronic devices.

2. The method of claim 1, wherein the ceramic substrate panel has a second side opposite the first side, and the electronic devices are mounted on the second side, and further comprising:

attaching the member to the first side of the ceramic substrate panel.

3. The method of claim 1, further comprising:

removing the member from the ceramic substrate panel after said encapsulation.

4. The method of claim 1, further comprising:

removing the member from the ceramic substrate panel after said singulating step.

5. The method of claim 1, wherein the electronic devices include semiconductor chips, and each singulated package includes at least one of the semiconductor chips.

6. The method of claim 1, wherein singulating the packages includes cutting through the mold compound.

7. The method of claim 6, wherein the electronic devices include semiconductor chips, the semiconductor chips are mounted on the second side of the substrate panel, the second side of the substrate panel is entirely flat, and the mold compound is provided on the second side of the substrate panel.

8. The method of claim 1, wherein the mold tool includes a top platen and a bottom platen, and at least one of the top and bottom platens clamp on the member around the perimeter of the ceramic substrate panel when the mold tool is closed.

9. The method of claim 1, wherein the electronic devices include semiconductor chips, the semiconductor chips are mounted on the second side of the substrate panel, the second side of the substrate panel is entirely flat, and the mold compound is provided on the second side of the substrate panel.

10. The method of claim 9, wherein the mold tool clamps on the member around the perimeter of the substrate panel when the mold tool is closed.

11. The method of claim 1, wherein a plurality of the ceramic substrate panels are attached to said member so that the member extends beyond the perimeters of all of the ceramic substrate panels, each of said ceramic substrate panels including said matrix of said electronic devices coupled thereto, and the mold tool clamps over the member outward of the perimeters of each said ceramic substrate panel without contacting the ceramic substrate panel, and a plurality of the packages are singulated from each said ceramic substrate panel.

12. The method of claim 11, further comprising a rectangular frame coupled to the member and surrounding the plurality of the ceramic substrate panels without contacting the ceramic substrate panels, wherein during said closing of the mold tool the mold tool clamps on the frame.

13. The method of claim 1, wherein the plurality of ceramic substrate panels are encapsulated in a single block of the mold compound.

14. The method of claim 1, wherein each of the ceramic substrate panels is encapsulated in an individual block of the mold compound.

15. A method for fabricating a plurality of semiconductor packages, the method comprising:

placing a member having a ceramic substrate panel and a frame attached thereto into a mold tool, said frame attached to the member surrounding and entirely outward of a perimeter of the ceramic substrate panel;

closing the mold tool, wherein the mold tool clamps on the member or the frame without contacting the ceramic substrate panel;

injecting a mold compound into the mold tool so as to encapsulate a first side of the ceramic substrate panel and a plurality of semiconductor chips coupled to said first side; and separating the encapsulated ceramic substrate panel into a plurality of semiconductor packages each including at least one of the semiconductor chips.

16. The method of claim 15, further comprising:

separating the member from the ceramic substrate panel.

17. The method of claim 15 wherein closing comprises clamping the mold tool on the frame.

18. The method of claim 15 wherein closing comprises clamping the mold tool on the member.

19. The method of claim 15 wherein closing comprises clamping the mold tool on the frame and the member.

20. The method of claim 15, wherein said separating the encapsulated ceramic substrate panel into a plurality of semiconductor packages comprises severing through the mold compound, and further comprising separating the member from the ceramic substrate panel.

21. The method of claim 15, wherein a plurality of the ceramic substrate panels are attached to said member and the frame surrounds all of the ceramic substrate panels, each of said ceramic substrate panels having a plurality of the semiconductor chips coupled to the first side thereof.

22. A method of making a package comprising:
providing a ceramic substrate attached to a member, wherein the ceramic substrate has an electronic device mounted thereon; and
overmolding the ceramic substrate and the electronic device with a plastic encapsulant in a mold tool, wherein the mold tool seals over the member and around the ceramic substrate entirely outside a perimeter of the ceramic substrate.

23. The method of claim 22, wherein the ceramic substrate includes peripheral sides, and the peripheral sides are covered by said plastic encapsulant.

24. The method of claim 22, wherein the electronic device is one of a plurality of electronic devices coupled to a first side of the ceramic substrate, the member is attached to an opposite second side of the substrate, and the member is removed after said overmolding.

25. The method of claim 22, further comprising singulating individual packages each including at least one said electronic device after said overmolding, wherein said singulating step severs the plastic encapsulant.

26. A method for fabricating a semiconductor package, the method comprising:
coupling a ceramic substrate to a flat temporary member, said ceramic substrate including a first side to which a semiconductor chip is coupled;
placing the ceramic substrate into a mold tool, and closing the mold tool without contacting the mold tool to the ceramic substrate, said mold tool forming a cavity over the temporary member and extending beyond an entire perimeter of the ceramic substrate;
injecting a plastic compound into the cavity of the mold tool so as to encapsulate the first side of the ceramic substrate and the semiconductor chip in a body of the plastic compound, and then hardening the plastic compound; and
removing the temporary member from the encapsulated ceramic substrate.

27. The method of claim 26, further comprising coupling a frame to the temporary member around the ceramic substrate, and clamping on the frame when closing the mold tool.

28. A method for fabricating a plurality of semiconductor packages, the method comprising:
coupling a flat ceramic substrate to a flat temporary member, said ceramic substrate including an entirely flat first side to which a plurality of semiconductor chips are coupled;
placing the ceramic substrate into a mold tool, and closing the mold tool without contacting the mold tool to the ceramic substrate, said mold tool forming a cavity over the temporary member and extending beyond an entire perimeter of the ceramic substrate;
injecting a plastic compound into the cavity of the mold tool so as to encapsulate the first side of the ceramic substrate and the semiconductor chip in a body of the plastic compound, and then hardening the plastic compound;
removing the temporary member from the ceramic substrate; and
singulating individual ones of the semiconductor packages from the encapsulated ceramic substrate, each said semiconductor package including at least one said chip, wherein said singulating severs the plastic compound.

29. The method of claim 28, wherein a plurality of the ceramic substrates are coupled to the flat temporary member, each of said ceramic substrates is entirely enclosed in the cavity without being contacted by the mold tool, and the first side of each of said ceramic substrates is encapsulated in the plastic compound.

30. The method of claim 29, wherein the plurality of ceramic substrates are encapsulated in a single block of the plastic compound.

31. The method of claim 29, wherein each of the ceramic substrates is encapsulated in an individual block of the plastic compound.

32. The method of claim 29, further comprising a rectangular frame coupled to the temporary member and surrounding the plurality of the ceramic substrates without contacting the ceramic substrates, wherein during said closing of the mold tool the mold tool clamps on the frame.

* * * * *